(12) United States Patent
Nikaido

(10) Patent No.: US 8,472,695 B2
(45) Date of Patent: Jun. 25, 2013

(54) METHOD AND APPARATUS FOR FAILURE ANALYSIS OF SEMICONDUCTOR INTEGRATED CIRCUIT DEVICES

(75) Inventor: Masafumi Nikaido, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 797 days.

(21) Appl. No.: 12/458,825

(22) Filed: Jul. 23, 2009

(65) Prior Publication Data

US 2010/0021049 A1     Jan. 28, 2010

(30) Foreign Application Priority Data

Jul. 28, 2008   (JP) .................. 2008-193312

(51) Int. Cl.
*G06K 9/00*   (2006.01)

(52) U.S. Cl.
USPC ........... 382/145; 382/144; 382/147; 382/149; 382/148; 382/151

(58) Field of Classification Search
None
See application file for complete search history.

(56) References Cited

U.S. PATENT DOCUMENTS

| | | | |
|---|---|---|---|
| 6,185,707 B1 * | 2/2001 | Smith et al. | 714/724 |
| 7,570,796 B2 * | 8/2009 | Zafar et al. | 382/144 |
| 2008/0109686 A1 | 5/2008 | Nikaido et al. | |

FOREIGN PATENT DOCUMENTS

| | | |
|---|---|---|
| JP | 2003-282665 | 10/2003 |
| JP | 2004-45132 A | 2/2004 |
| JP | 2008-116332 | 5/2008 |

OTHER PUBLICATIONS

German Office Action dated Nov. 2, 2010, with English translation.
Notice of Grounds for Rejection dated Jul. 20, 2010, with partial English translation.

\* cited by examiner

*Primary Examiner* — Ryan Zeender
*Assistant Examiner* — Allen Chein
(74) *Attorney, Agent, or Firm* — McGinn IP Law Group, PLLC

(57) ABSTRACT

A method of analyzing of a semiconductor integrated circuit includes inspecting a physical defect in a semiconductor wafer, subjecting the semiconductor integrated circuit chip to a logic test and extracting a malfunctioning chip, analyzing a detected signal observed from the malfunctioning chip by an analyzer, obtaining the layer and coordinates of a circuit related the detected signal, collating the physical defect with the circuit, and identifying the physical defect associated with the circuit. The layer and coordinates of the circuit is extracted using design data. An inspection step identifying information is collated with the layer of the circuit, and an in-chip coordinates of the physical defect is collated with the coordinated of the circuit.

18 Claims, 18 Drawing Sheets

FIG. 4

```
# CHIP POSITION,INSPECTION STEP,DEFECT CENTER COORDINATES (X,Y), DEFECT SIZE (X,Y);
X005Y005.   STEP1.   (10020. 1230).     (20. 10)   ;
X005Y005.   STEP3.   (234500. 20090).   (100. 5)   ;
X012Y034.   STEP2.   (-4002. 50234).    (10. 200)  ;
```

FIG. 6

```
# CHIP POSITION,LAYER,LOWER-LEFT COORDINATES (X,Y),UPPER-RIGHT COORDINATES (X,Y);
X005Y005.  METAL2.  (10020. 1230)-(10050. 1300).
           VIA2.    (10020. 1230)-(10025. 1235).
           METAL3.  (90050. 1055)-(10025. 1235)   ;
X012Y034.  NDIFF.   (-3800. 50000)-(-3700. 50200)  ;
```

FIG. 7

```
#   INSPECTION STEP NAME, LAYER NAME;
STEP1.   METAL2.  VIA2.  METAL3   :
STEP2.   NDIFF.  PDIFF.  CONTACT.  METAL1  :
STEP3.   METAL3.  VIA3.  METAL4   :
```

METHOD AND APPARATUS FOR FAILURE ANALYSIS OF SEMICONDUCTOR INTEGRATED CIRCUIT DEVICES

REFERENCE TO RELATED APPLICATION

This application is based upon and claims the benefit of the priority of Japanese patent application No. 2008-193312, filed on Jul. 28, 2008, the disclosure of which is incorporated herein in its entirety by reference thereto.

TECHNICAL FIELD

This invention relates to a method and apparatus for failure analysis of semiconductor integrated circuits. More particularly, the invention relates to a failure analysis method and apparatus, such as an emission analysis or OBIRCH analysis, for applying a physical signal of some kind to a semiconductor integrated circuit and performing failure analysis based upon an observed detected signal from the semiconductor integrated circuit.

BACKGROUND

For example, with conventional failure analysis of a semiconductor integrated circuit (LSI chip), an available method is to use a fault simulator or the like to logically narrow down locations (logical fault candidates) that are the cause of failure in a semiconductor integrated circuit.

In a case where a semiconductor integrated circuit has a physical abnormality, failure locations can be narrowed down by an analyzer such as an emission analysis or OBIRCH analysis. For example, an image in which a hot spot has been detected can be acquired by an emission microscope, and an image in which an OBIRCH reaction has been detected can be acquired by a OBIRCH analysis.

However, although a light emission or an OBIRCH reaction (both of which shall be referred to as a "detected signal" below) is a signal from a circuit related to the location of a physical abnormality, the signal is not necessarily at the location of the physical abnormality per se. For this reason, technicians make a determination from various aspects such as layout data, logical circuit diagrams and detected signals and then estimate where abnormalities are located. Next, the physical abnormality locations are observed by observation equipment such as an FIB unit.

Such a conventional method and apparatus for failure analysis of a semiconductor integrated circuit are described in Patent Document 1. Patent Document 1 describes identifying a genuine failure location using an emission analysis and identifying the cause of the failure. Patent Document 1 describes conducting a function test of a semiconductor integrated circuit that undergoes failure analysis; specifying a node of a failure location at which a desired electrical characteristic is not obtained; acquiring an emission image by detecting a light-emission spot, which is based upon hot electrons emitted from the semiconductor integrated circuit, using an emission analysis; conducting failure analysis based upon the difference between the emission image and an emission image that results from hot electrons emitted from a conforming semiconductor integrated circuit; identifying the failure location and generating coordinate data thereof; accepting the test results of the function test and analytical results from the emission analysis and determining whether a failure has occurred in the semiconductor integrated circuit that undergoes the failure analysis; and when a failure has occurred, determining the cause of the failure.

Further, in Patent Document 1, a dust inspection for dust attached to a circuit surface is conducted at the time of the manufacturing process and the coordinates of the position of dust are detected (Paragraph No. 0019). A light-emission spot resulting from hot electrons is detected using an emission analysis, and an emission image is acquired (Paragraph No. 0025). Node data and coordinate data corresponding to the node of the circuit ahead of the node corresponding to the coordinate data of the emission spot are generated (Paragraph No. 0065). On the basis of this node data and coordinate data, the results of the dust inspection and data from a navigation tool, processing for determining whether a failure has occurred is executed and, if a failure has occurred, the coordinate data of this location is generated (Paragraph No. 0065). Further, as described in Paragraph Nos, 0021, 0022, etc., since a node possesses an electrical signal level which is an H level or an L level, it is wiring (referred to as a "net" below) connecting a transistor circuit with another transistor circuit.

[Patent Document 1]
Japanese Patent Kokai Publication No. JP2004-45132A

SUMMARY

The disclosure of the above Patent Document is incorporated herein by reference thereto. Now, the following analyses are given by the present invention.

Although a detected signal obtained from an analyzer such as an emission analysis or OBIRCH analysis is a signal from a circuit related to the location of a physical abnormality, the signal is not necessarily at the location of the physical abnormality per se. This means that the technician must make a determination from various aspects such as layout data, logical circuit diagrams and detected signals. Furthermore, in order to identify the location of a physical abnormality, detailed physical analysis using observation equipment such as an FIB unit is necessary.

With the failure analysis method described in Patent Document 1, coordinates are acquired which represent a dust position obtained from a dust inspection for dust attached to a circuit surface at the time of manufacture. From the coordinate data of an emission spot that results from hot electrons, node data and coordinate data corresponding to the node of the circuit ahead of the node corresponding to the coordinate data of the emission spot are acquired by using an emission analysis. On the basis of this node data and coordinate data, the results of the dust inspection and data from a navigation tool, processing for determining whether a failure has occurred is executed and, if a failure has occurred, the coordinate data of this location is generated. However, in accordance with research conducted by the inventor, physical defects associated with detected signals obtained from an emission detector cannot be identified accurately with this method.

Specifically, failures have various modes. Depending upon the each failure mode, a location at which a detected signal is observed and the failure location that is the cause of the detected signal (the location at which a physical defect exists) may differ. A failure location is not necessarily at a location where a light emission is observed or in the circuit ahead of the node at which a light emission is observed, as described in Patent Document 1. An example of this is illustrated in FIG. 8. FIG. 8 is an example in which a net where the signal level is the low level is shorted to a high-level power-source line. An N-channel MOS transistor of an inverter circuit on the input side of the net having the physical abnormality turns on and a light emission is observed. In the case of a defect of such mode, the genuine failure location cannot be found with the technique disclosed in Patent Document 1.

Further, a semiconductor integrated circuit is a multilayer structure in which a functional circuit is constructed as a cell in an underlying layer and multiple layers of wiring are laid out on the functional circuit. A physical defect is inspected as by an external inspection during the course of the manufacturing process of such a multilayer semiconductor integrated circuit. Accordingly, depending upon in which step of the process the physical defect was detected by the inspection, in which layer of the multilayer structure the physical defect exists will differ. Further, with an OBIRCH analysis or the like, the layer in which a detected signal has occurred can be identified. Therefore, in order to identify the physical defect that is associated with the detected signal, it is necessary to render a decision upon correctly recognizing the layer in which the physical defect was detected (the name of the inspection step), the layer structure of the layout design data and the layer in which the detected signal was detected.

Furthermore, in the case of a finely patterned semiconductor integrated circuit, there are instances where it is necessary to take into consideration the fact that there may be a coordinate error in an observed detected signal or physical defect.

According to a first aspect of the present invention, there is provided a method of analyzing failure of a semiconductor integrated circuit, which comprises inspecting a physical defect in a semiconductor wafer at the time of manufacture of a semiconductor integrated circuit chip, and acquiring a chip position, an inspection step identifying information and in-chip coordinates of this physical defect. The method further comprises subjecting the semiconductor integrated circuit to a logic test in the wafer or after assembly, and extracting a malfunctioning chip and position of this chip. The method further comprises analyzing a detected signal, which is observed from the malfunctioning chip, by an analyzer, and acquiring coordinates and a layer where the detected signal was detected. The method further comprises extracting a layer and coordinates of a circuit with regard to a cell in which the detected signal was detected and a net connected to this cell, or a net in which the detected signal was detected and a cell connected to this net, using design data and the coordinates and layer of the detected signal. And the method further comprises collating the inspection step identifying information of the physical defect with the layer of the circuit, collating the in-chip coordinates of the physical defect with the circuit coordinates, and identifying the physical defect associated with the circuit.

According to a second aspect of the present invention, there is provided an apparatus for analyzing failure of a semiconductor integrated circuit which comprises; a chip selecting unit that subjects a semiconductor integrated circuit chip to a logic test based upon test data, and outputs selection data that including a chip position of a malfunctioning chip in a semiconductor wafer; a signal detecting unit, which includes an analyzer, that analyzes a detected signal, which has been observed from the malfunctioning chip, by the analyzer, and outputs detected signal data including coordinates and a layer where the detected signal was detected; and a circuit extracting unit that inputs design data and the detected signal data and extracts a layer and coordinates of a circuit with regard to a cell in which the detected signal was detected and a net connected to this cell, or a net in which the detected signal was detected and a cell connected to this net, and outputs the layer and coordinates of the circuit as circuit extraction data. The apparatus further comprises: a collating unit that reads physical defect data, inspection step/layer correspondence data, and the circuit extraction data, identifies the physical defect data associated with the circuit extracted by the circuit extracting unit and outputs this data as collation-result data; and a display unit for displaying the collation-result data. The physical defect data includes an inspection step identifying information under which the physical defect was detected at the time of manufacture of the semiconductor integrated circuit chip, and in-chip coordinates of the physical defect. The inspection step/layer correspondence data includes correspondence between an inspection step in which a physical defect is detected and a layer of a circuit According to a third aspect of the present invention, there is provided a computer-readable storage medium storing a program for causing a computer to execute a failure analysis processing of a semiconductor integrated circuit. The processing includes: signal detection processing that extract detected signal data that includes coordinates and a layer where a detected signal was detected from analytical data that is the result of failure analysis of a semiconductor integrated circuit by an analyzer; circuit extraction processing, that includes inputting design data of the semiconductor integrated circuit and the detected signal data, extracting a layer and coordinates of a circuit with regard to a cell in which the detected signal was detected and a net connected to this cell, or a net in which the detected signal was detected and a cell connected to this net, and outputting the layer and coordinates of the circuit as circuit extraction data. The processing further includes: collation processing that includes, inputting physical defect data, inspection step/layer correspondence data, and the circuit extraction data, identifying the physical defect data associated with the circuit extracted by the circuit extraction processing, and outputting this data as collation-result data; and display processing that displays the collation-result data. The physical defect data includes an inspection step identifying information under which the physical defect was detected at the time of manufacture of the semiconductor integrated circuit chip, and in-chip coordinates of the physical defect. The inspection step/layer correspondence data includes correspondence between an inspection step in which a physical defect is detected and a layer of a circuit According to a fourth aspect of the present invention, there is provided a computer-readable storage medium storing a program for causing a computer to execute the above-described method of analyzing failure of a semiconductor integrated circuit.

According to a fifth aspect of the present invention, there is provided a computer-readable storage medium storing a program for causing a computer to function as the above-described apparatus for analyzing failure of a semiconductor integrated circuit.

The meritorious effects of the present invention are summarized as follows.

In accordance with the present invention, a physical defect associated with a detected signal obtained from an analyzer such as an emission analysis or OBIRCH analysis can readily be identified in failure analysis of a semiconductor integrated circuit. Specifically, a detected signal is related to the location of a physical abnormality. However, even when the detected signal is not necessarily the location of the physical abnormality itself, the location of a physical abnormality can be identified automatically. In particular, by extracting the cell at the coordinate position of the detected signal and the net connected to the cell, the circuit that contains the location of the physical abnormality can be extracted reliably when the detected signal is produced within the cell. Further, by correlating the inspection step of the physical defect and the layer of the circuit obtained from the detected signal, in which step of the manufacturing process the physical defect was the cause of the detected signal can be identified accurately even with regard to an LSI device, which is a multilayer structure.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 4 is an example of physical defect data in an exemplary embodiment of the present invention;

FIG. 6 is an example of detected signal data in an exemplary embodiment of the present invention;

FIG. 7 is an example of inspection step/layer correspondence data obtained by previously recording inspection step identifying information and corresponding circuit layers in an exemplary embodiment of the present invention;

PREFERRED MODES

The present invention will now be described with reference to the drawings.

Figure 1:
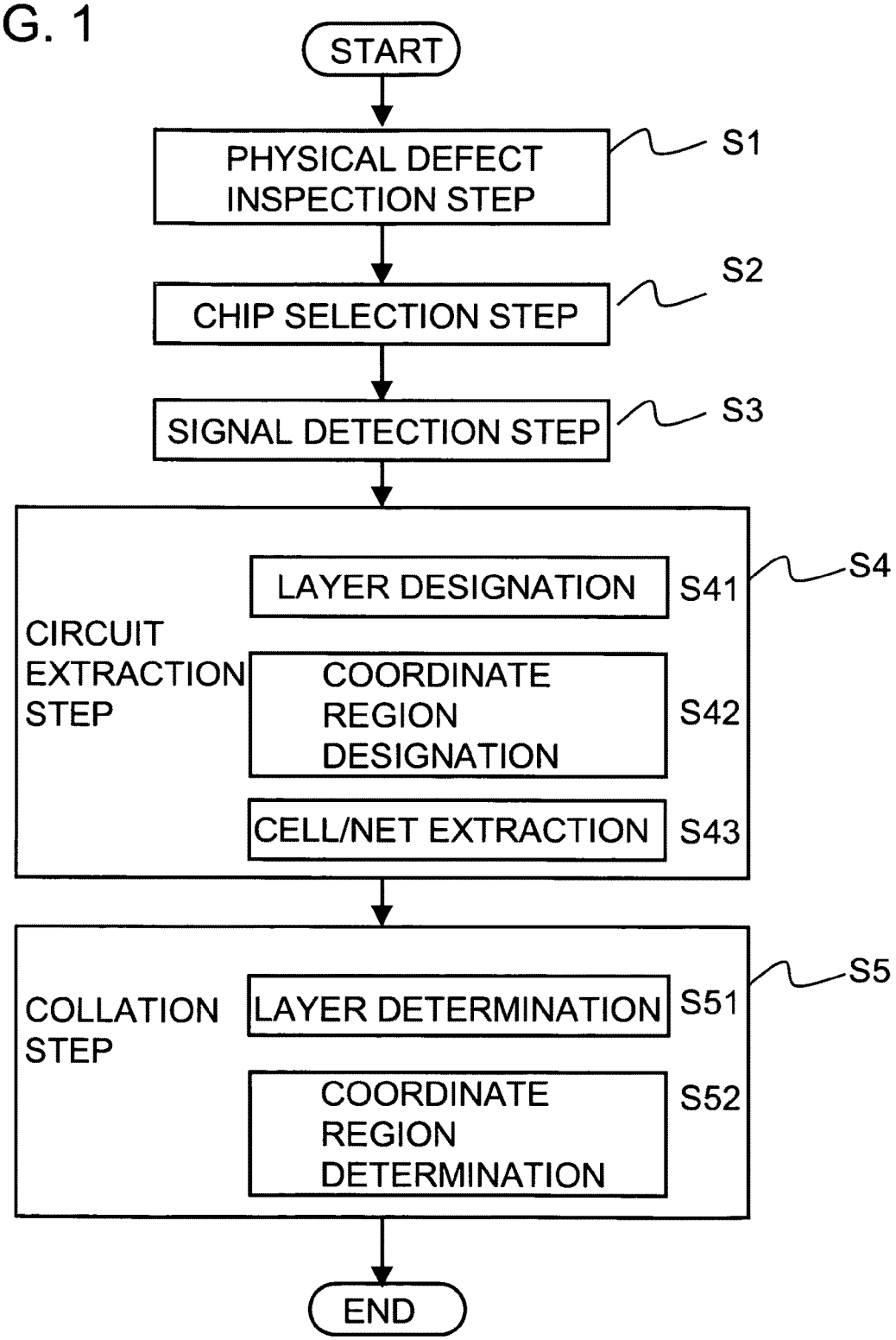
FIG. 1 is a flowchart illustrating the processing of a method of analyzing failure of a semiconductor integrated circuit according to an exemplary embodiment of the present invention.

As illustrated in FIG. 1, a method of analyzing failure of a semiconductor integrated circuit according to the present invention comprises a physical defect inspection step (step S1) of inspecting for a physical defect in a semiconductor wafer at the time of manufacture of a semiconductor integrated circuit chip, and acquiring a chip position (see FIG. 4), inspection step identifying information (e.g., inspection step name; see FIG. 4) and in-chip coordinates (see FIG. 4) of this physical defect (see FIG. 3); a chip selection step (step S2) of subjecting the semiconductor integrated circuit to a logic test in the wafer or after assembly, and extracting a malfunctioning chip and position of this chip; a signal detection step (step S3) of analyzing a detected signal (see FIG. 5), which is observed from the malfunctioning chip, by an analyzer 7, and acquiring coordinates and a layer (see FIG. 6) where the detected signal was detected; a circuit extraction step (step S4) of extracting a layer and coordinates of a circuit with regard to a cell in which the detected signal was detected and a net connected to this cell, or a net in which the detected signal was detected and a cell connected to this net, using design data and the coordinates and layer of the detected signal (see FIG. 6); and a collation step (step S5) of collating the inspection step identifying information (see FIG. 4) of the physical defect with the layer of the circuit, collating the in-chip coordinates (see FIG. 4) of the physical defect with the circuit coordinates, and identifying the physical defect associated with the circuit.

Figure 13:
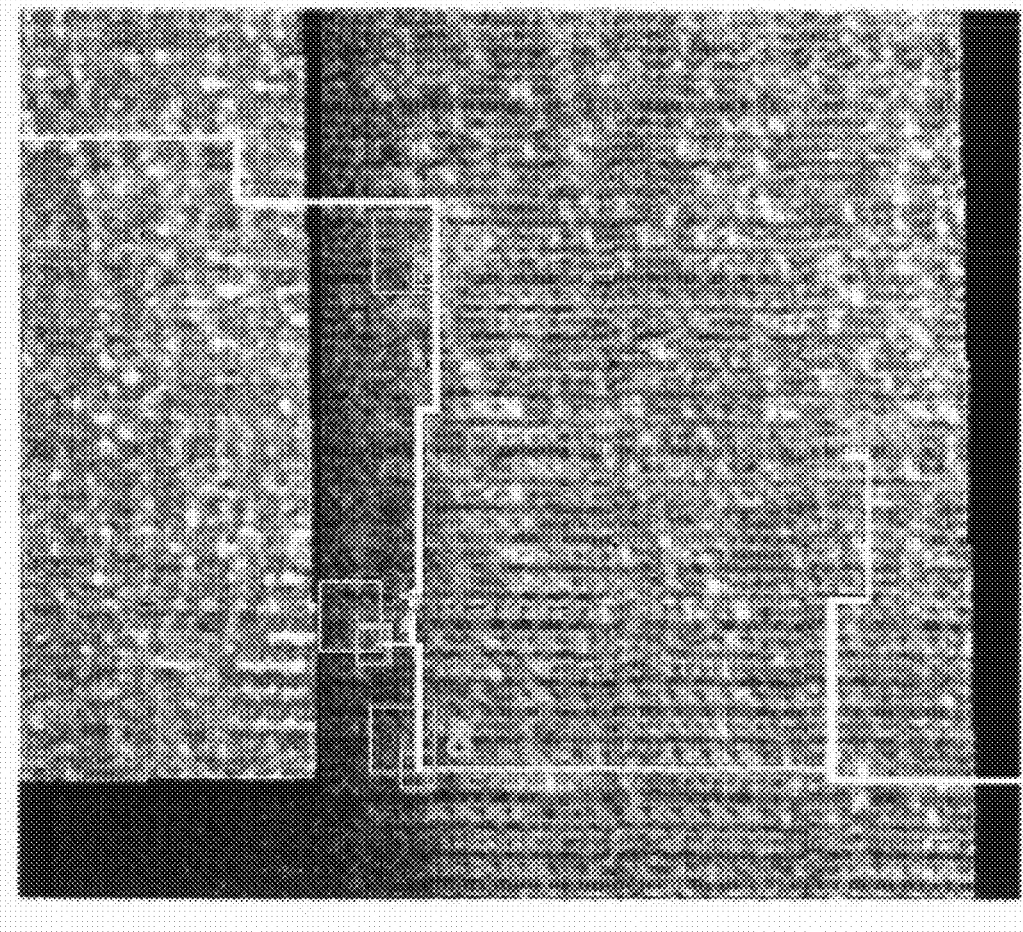
FIG. 13 is a diagram illustrating an example of display data in which detected signals and layout of extracted circuits are displayed in superimposed form in an exemplary embodiment of the present invention.
Figure 14:
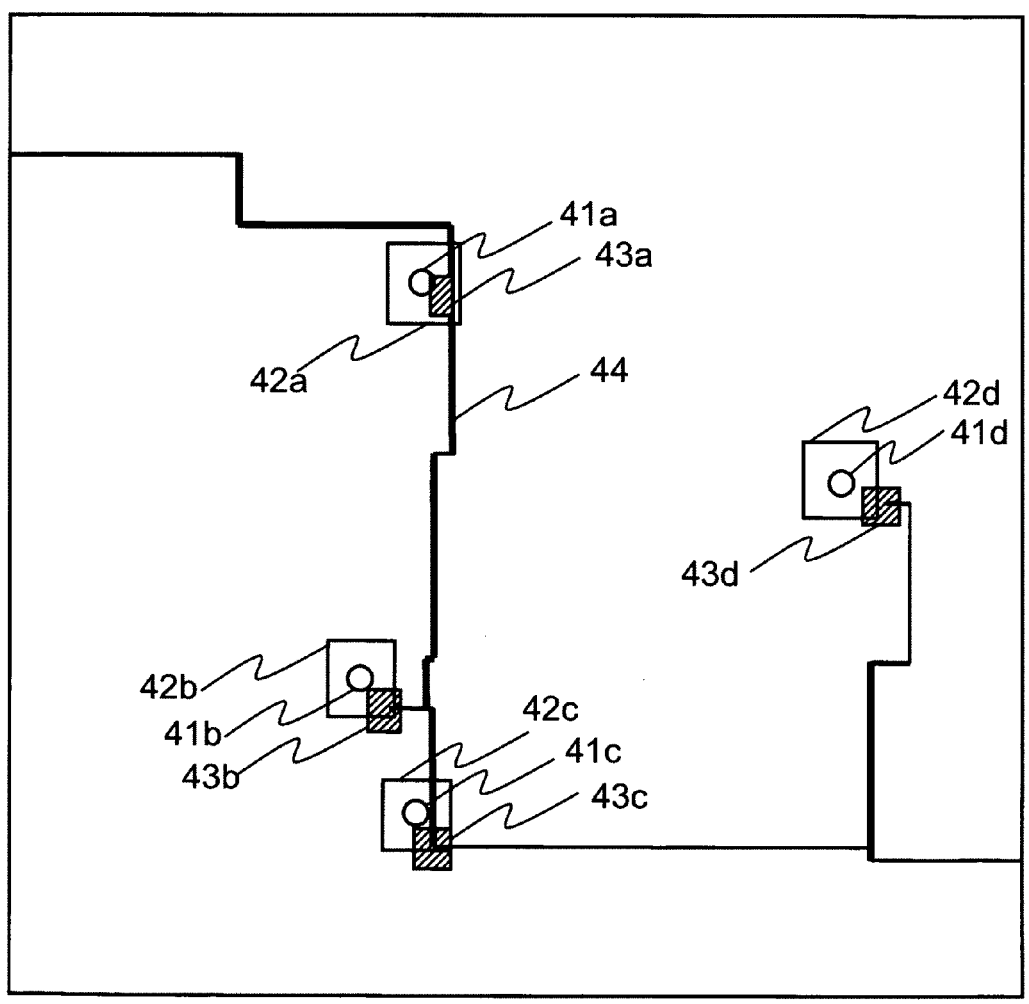
FIG. 14 is a diagram useful in describing FIG. 13.

Further, as illustrated in FIGS. 1, 13 and 14, in the method of analyzing failure of a semiconductor integrated circuit according to the present invention, the signal detection step (step S3) may acquire an image (see FIG. 5) that includes a detected signal, and the circuit extraction step (step S4) may cause an the image and layout design data to be displayed in superimposed form (FIG. 13) and may extract a layer and coordinates of circuits (43a, 43b, 43c, 43d, 44) associated with this detected signal. In a case where it is doubtful as to whether the detected signal obtained at the signal detection step is one specific to a malfunctioning chip, the technician observes the image and can determine whether the signal is a genuine detected signal specific to a malfunctioning chip or a false detected signal also generated by a conforming chip.

Figure 15:
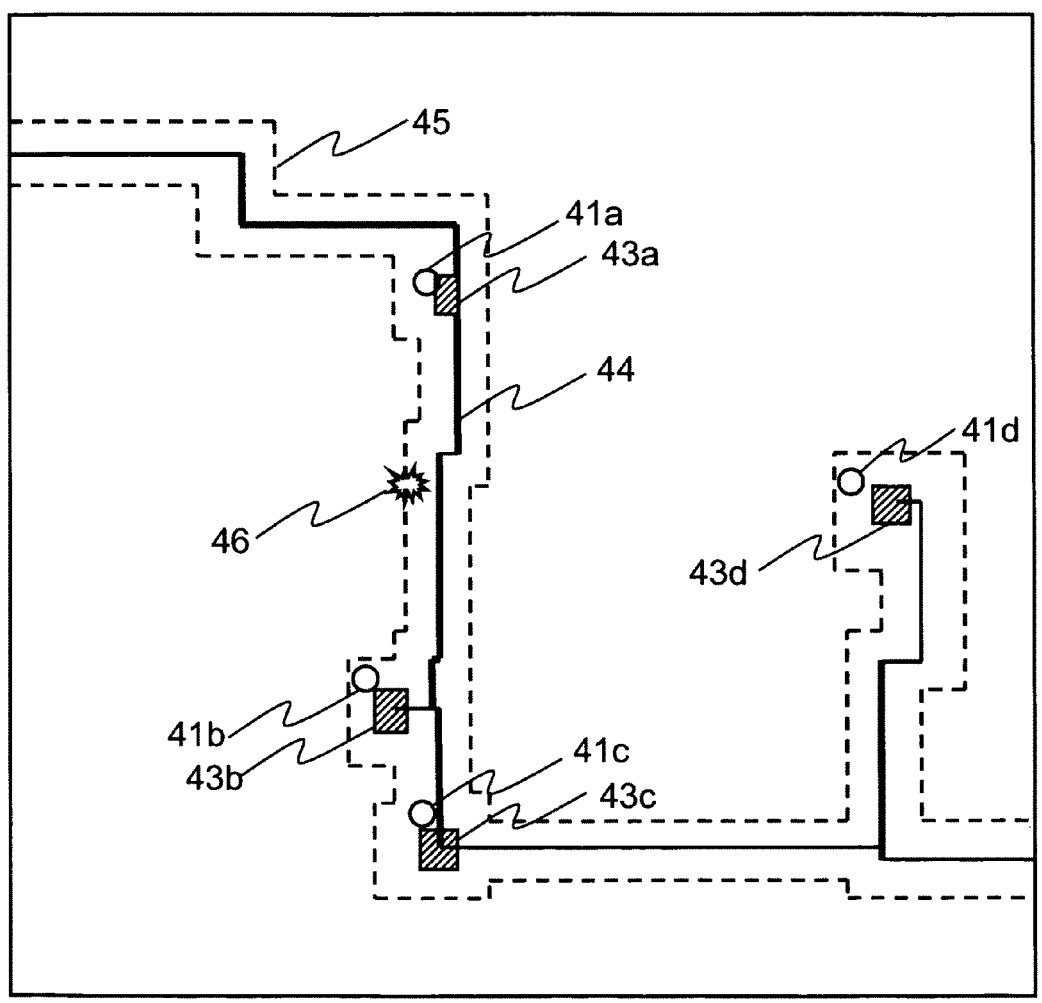
FIG. 15 is an explanatory view illustrating an example in which coordinates of circuits are expanded into nearby specific zones and collated with coordinates of circuits at a collation step in an exemplary embodiment of the present invention.

Further, as shown in FIGS. 1 and 15, the collation step (step S5) may extract a physical defect 46 whose coordinates overlap a region 45 obtained by expanding coordinates of circuits (43a, 43b, 43c, 43d, 44) into nearby specific zones. The collation can be performed correctly, even if the coordinates of the physical defect extracted at the physical defect inspection step has a measurement error, by expanding the coordinates of the circuits into nearby specific zones.

Figure 16:
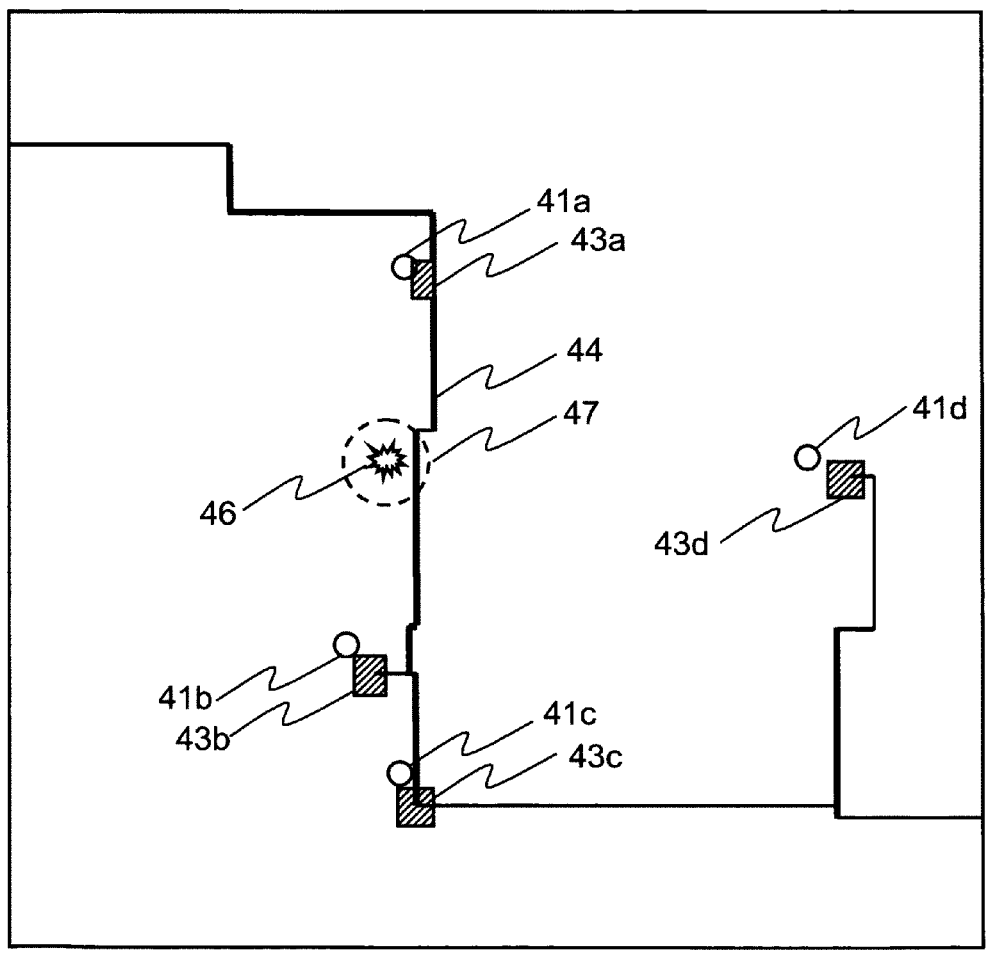
FIG. 16 is an explanatory view illustrating an example in which coordinates of a physical defect are expanded into a nearby specific zone and collated with coordinates of a circuit at a collation step in an exemplary embodiment of the present invention.

Further, as shown in FIGS. 1 and 16, in a case where the coordinates of circuits (43a, 43b, 43c, 43d, 44) reside in a specific region 47 near a physical defect, the collation step (step S5) may extract this physical defect. A coordinate error of a physical defect can be remedied also by expanding the coordinates of the physical defect into a nearby specific zone.

Further, as illustrated in FIGS. 1 and 14, in the method of analyzing failure of a semiconductor integrated circuit according to the present invention, the circuit extraction step (step S4) may, using the design data, extract the layer and coordinates of the circuit with regard to cells (43a, 43b, 43c, 43d) in specific zones (42a, 42b, 42c, 42d) neighboring detected signals (41a, 41b, 41c, 41d) and a net 44 connected to these cells, or a net passing through a layer of a detected signal and located in a specific zone neighboring the detected signal and cells connected to this net.

Figure 17:
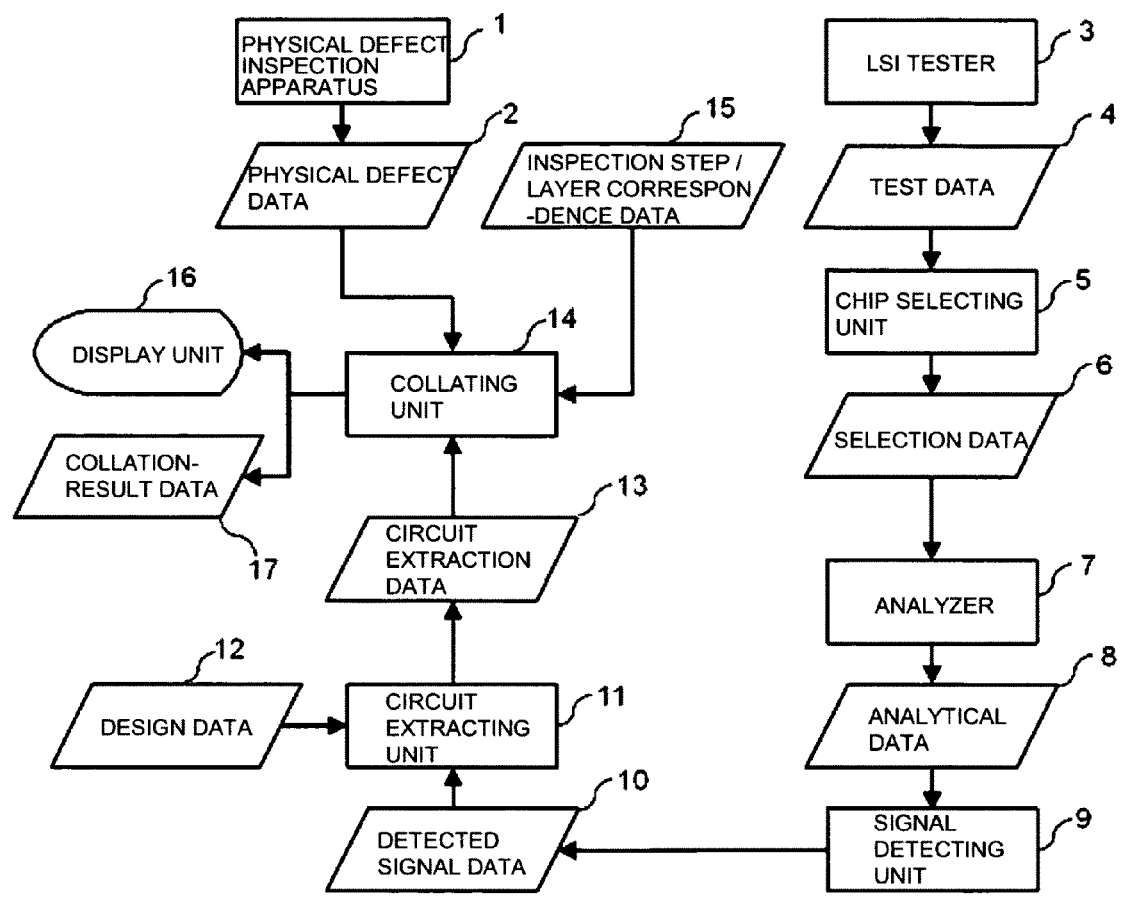
FIG. 17 is a block diagram illustrating the configuration of a failure analyzer of a semiconductor integrated circuit according to an exemplary embodiment of the present invention.

Further, as illustrated in FIG. 17, an apparatus for analyzing failure of a semiconductor integrated circuit according to an exemplary embodiment of the present invention comprises a chip selecting unit 5 for subjecting the semiconductor integrated circuit to a logic test based upon test data 4, and outputting selection data 6 that includes a chip position of a malfunctioning chip in a semiconductor wafer; a signal detecting unit 9, which includes an analyzer 7, for analyzing a detected signal, which has been observed from the malfunctioning chip, by the analyzer 7, and outputting detected signal data 10 (see FIG. 6) that includes coordinates and a layer where the detected signal was detected; a circuit extracting unit 11, to which design data 12 and the detected signal data 10 are input, for extracting a layer and coordinates of a circuit with regard to a cell in which the detected signal was detected and a net connected to this cell, or a net in which the detected signal was detected and a cell connected to this net, and outputting the layer and coordinates of the circuit as circuit extraction data 13; with regard to a physical defect of the semiconductor integrated circuit chip detected at the time of manufacture of the semiconductor integrated circuit chip, a collating unit 14, to which are input physical defect data 2 (see FIG. 4) obtained by recording an inspection step identifying information (e.g., inspection step name) under which the physical defect was detected and in-chip coordinates of the physical defect, inspection step/layer correspondence data 15 (see FIG. 7), which is data obtained by previously recording the inspection step identifying information and a corresponding layer of the circuit, and the circuit extraction data 13, for identifying the physical defect data associated with the circuit extracted by the circuit extracting unit 11 and outputting this data as collation-result data; and a display unit 16 for displaying the collation-result data.

Further, as illustrated in FIGS. 13, 14 and 17, in the apparatus (FIG. 17) for analyzing failure of a semiconductor integrated circuit according to the present invention, the signal detecting unit 9 may output image data that includes a detected signal (FIG. 13), and the circuit extracting unit 11 may superimpose the image data and layout design data, extract the circuit (43a, 43b, 43c, 43d, 44) and output it as circuit extraction data. The technician observes the image data and can determine whether the detected signal is a genuine detected signal or false. By displaying the circuit extraction data, the technician can determine whether the extracted circuit is appropriate or not.

Further, as illustrated in FIGS. 15 and 17, the apparatus (FIG. 17) for analyzing failure of a semiconductor integrated circuit according to the present invention executes processing for collating an inspection step of a physical defect with a layer of a circuit extracted from the detected signal, based upon the inspection step/layer correspondence data 15 (see FIG. 7), the inspection step identifying information of the physical defect data 2 (see FIG. 4) and the layer of the circuit extraction data 13, expanding the coordinates of circuits (43a, 43b, 43c, 43d, 44) into a nearby specific zone (45) and performing collation to determine whether there is overlap with the in-chip coordinates of the physical defect 46, thereby collating the coordinates of the physical defect with the coordinates of the circuit. A coordinate error of a physical defect can be remedied by expanding the coordinates of the physical defect into a nearby specific zone.

Further, as illustrated in FIGS. 16 and 17, the apparatus (FIG. 17) for analyzing failure of a semiconductor integrated circuit according to the present invention executes processing for collating an inspection step of a physical defect with a layer of a circuit extracted from the detected signal based upon the inspection step/layer correspondence data 15 (see FIG. 7), the inspection step identifying information of the physical defect data 2 (see FIG. 4) and the layer of the circuit extraction data 13, expanding the in-chip coordinates of the physical defect 46 into a nearby specific zone (47) and collating the in-chip coordinates with the coordinates of the circuits (43a, 43b, 43c, 43d, 44). A coordinate error of a physical defect can be remedied also by expanding the coordinates of the physical defect into a nearby specific zone.

Figure 18:
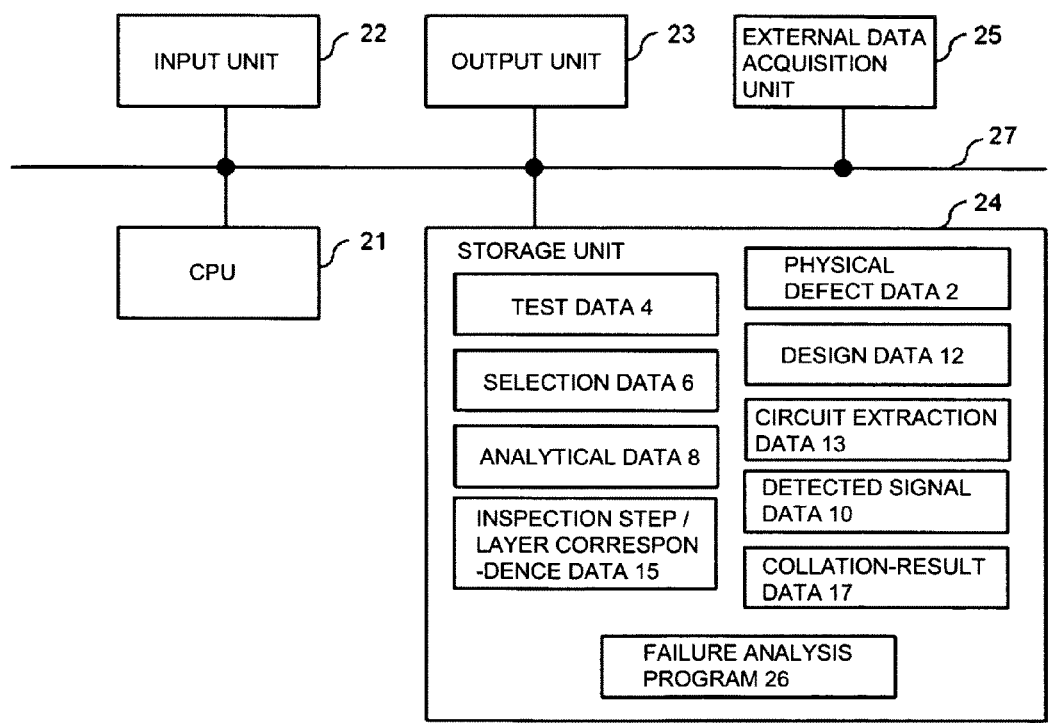
FIG. 18 is a block diagram for a case where a failure analyzer according to an exemplary embodiment of the present invention is constructed using a computer.

Further, as shown in FIGS. 17 and 18, a program 26 for analyzing failure of a semiconductor integrated circuit according to the present invention causes a computer to execute the following processing: signal detection processing for extracting detected signal data 10 (see FIG. 6) that includes coordinates and a layer where a detected signal (see FIG. 5) was detected from analytical data 8 that is the result of failure analysis of a semiconductor integrated circuit by an analyzer 7; circuit extraction processing, to which are input design data 12 of the semiconductor integrated circuit and the detected signal data 10, for extracting a layer and coordinates of a circuit with regard to a cell in which the detected signal was detected and a net connected to this cell, or a net in which the detected signal was detected and a cell connected to this net, and outputting the layer and coordinates of the circuit as circuit extraction data 13; with regard to a physical defect detected at the time of manufacture of the semiconductor integrated circuit chip, collation processing, to which are input physical defect data 2 (see FIG. 4) obtained by recording an inspection step name under which the physical defect was detected and in-chip coordinates of the physical defect, inspection step/layer correspondence data 15 (see FIG. 7), which is data obtained by previously recording inspection step identifying information (e.g., the inspection step name) and a corresponding layer of the circuit, and the circuit extraction data 13, for identifying the physical defect data associated with the circuit extracted by the circuit extraction processing and outputting this data as collation-result data; and display processing for displaying the collation-result data.

Specific exemplary embodiments will now be described in detail with reference to the drawings.

First Exemplary Embodiment

FIG. 1 is a flowchart illustrating the processing of a method of analyzing failure of a semiconductor integrated circuit according to an exemplary embodiment of the present invention. The flow comprises the following five steps: a physical defect inspection step (step S1) of inspecting for a physical defect in a semiconductor wafer at the time of manufacture of a semiconductor integrated circuit chip; a chip selection step (step S2) of subjecting each chip of a wafer to a test and selecting a defective chip; a signal detection step (step S3) of acquiring a detected signal through use of an analyzer applied to the chip selected as being defective; a circuit extraction step (step S4) of extracting a circuit associated with the detected signal; and a collation step (step S5) of collating the coordinates and the layer of the physical defect obtained at the physical defect inspection step (step S1) with the those of the circuit obtained by the circuit extraction step (step S4), and identifying the physical defect associated with the circuit.

Figure 2:
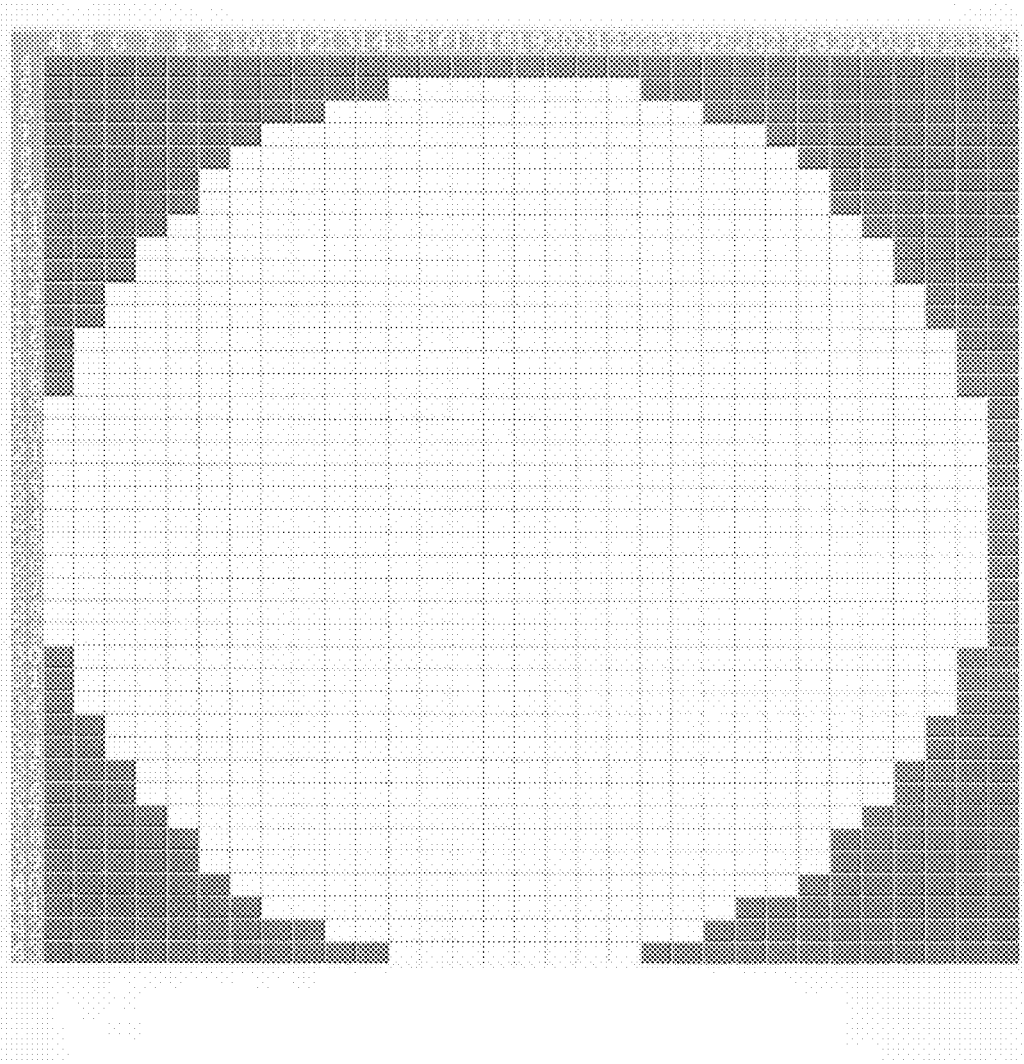
FIG. 2 is an example of a map illustrating chip positions within a semiconductor wafer.
Figure 3:
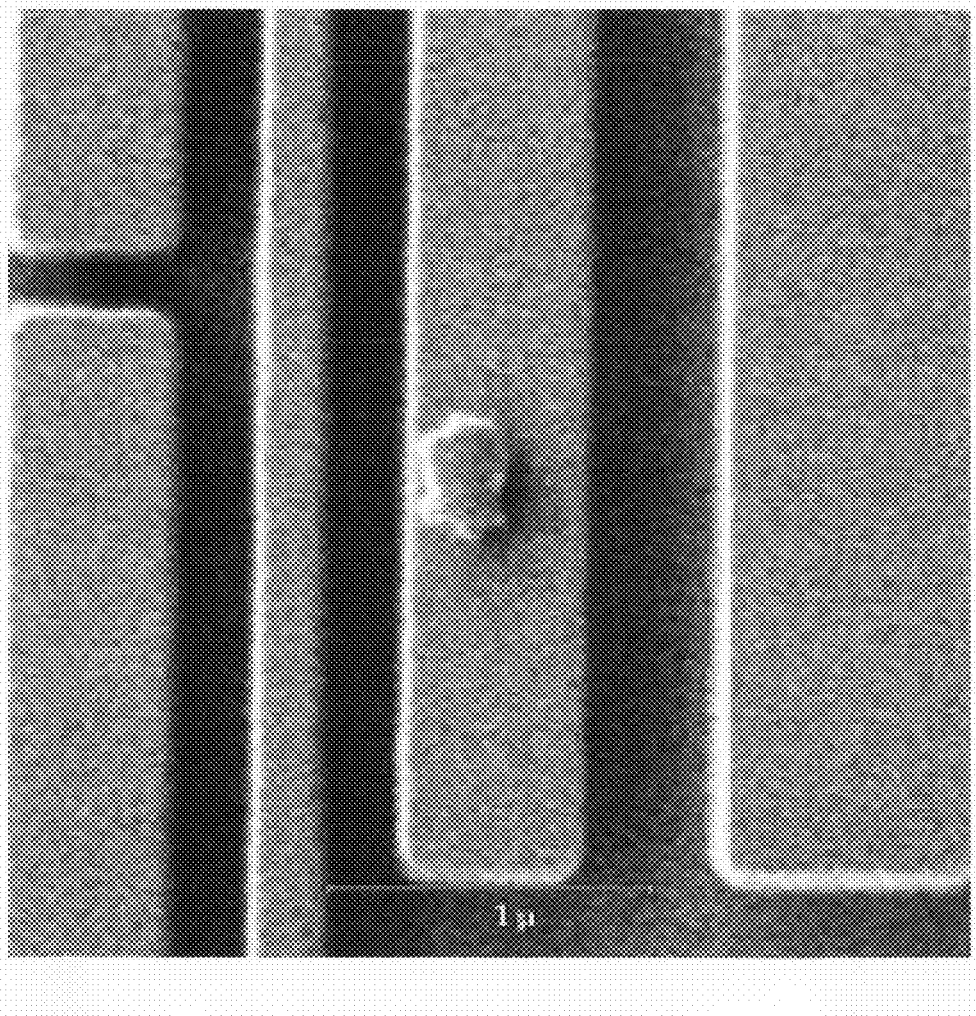
FIG. 3 is an example of a physical defect in a semiconductor integrated circuit.

First, at the physical defect inspection step (step S1), the semiconductor wafer is inspected for presence of a physical defect by a visual inspection during the course of manufacture of the semiconductor integrated circuit. The manufacturing process of the semiconductor integrated circuit includes a step of manufacturing a substrate that will serve as the cell of the semiconductor integrated circuit, a step of manufacturing lower-layer wiring that will serve mainly as wiring within the cell, and a step of manufacturing upper-layer wiring that will serve as wiring outside the cell. A visual inspection is performed at each step as necessary. For a physical defect that has been discovered by this physical defect inspection step, the following are recorded as physical defect data of the kind shown in FIG. 4: the chip position, in the semiconductor wafer, of the semiconductor integrated circuit chip in which the physical defect was discovered; the inspection step identifying information (e.g., inspection step name) under which the physical defect was discovered; the center coordinates of the physical defect in the chip; and the size of the defect. With regard to chip position, the position of the chip where a physical defect was discovered is specified by X and Y coordinates in the semiconductor wafer as a whole, as illustrated in FIG. 2. Further, an example of a physical defect is illustrated in FIG. 3. It should be noted that an "inspection step name" itself does not have any particular meaning but it will suffice if the name can be used to identify, in post-processing, in which step of the manufacturing process the physical defect was discovered by the inspection.

Next, at the chip selection step (step S2), the semiconductor integrated circuit chip is subjected to a logic test and a malfunctioning chip is identified. The position of a chip that has malfunctioned is recorded in advance. After the manufacture of the semiconductor wafer is completed, the logic test may be conducted in the wafer state or may be conducted after the wafer is divided into chips and the chips are assembled into packages or the like.

Figure 5:
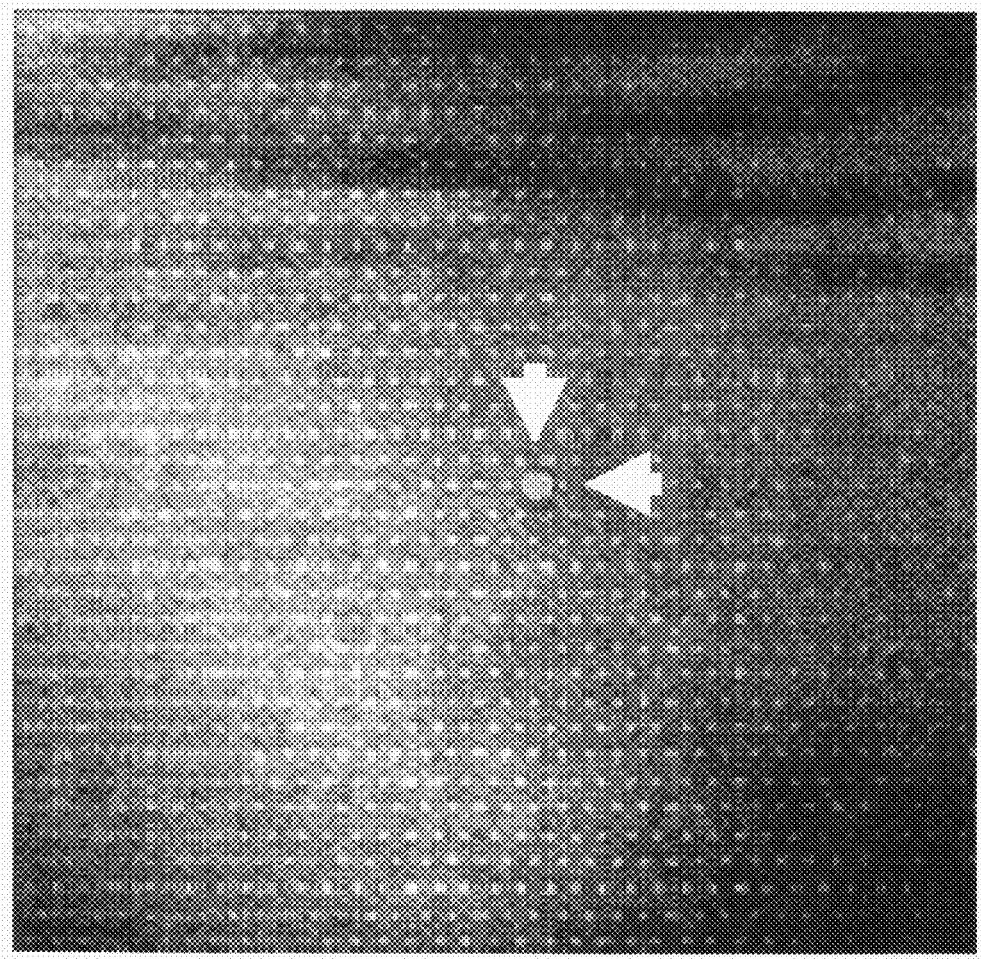
FIG. 5 is an example of a detected signal observed by a failure analyzer in an exemplary embodiment of the present invention.

At the signal detection step (step S3), the malfunctioning chip identified at the chip selection step is observed by an analyzer such as an emission analysis or ORBICH analyzer to measure a detected signal observed from the malfunctioning chip. FIG. 5 illustrates an image that is a result of superimposing the chip image and an emission image (detected signal) by an emission analysis. The tips of the arrows point to the emission image (detected signal). Although it is difficult to see in the figure, the image actually can be recognized in color and therefore the detected signal can be identified more easily than is ascertainable from the figure. FIG. 6 is an example of detected signal data acquired at the signal detection step. The signal detection step acquires chip position in the wafer as well as the coordinates and layer of the detected signal, which is a thermal emission or light emission from the chip, obtained by the analyzer. In the case of a light emission, since there is a possibility of a light emission from a cell and a light emission from a net, the cell and all wiring layers are the layers acquired at this step. In the case of an OBIRCH reaction, the layer in which the OBIRCH reaction is obtained can be determined by the strength of the laser applied, and therefore the layer in which the OBIRCH reaction is obtained is recorded.

The circuit extraction step (step S4) extracts the location of a circuit, in which there is a possibility that a failure has actually occurred, from the detected signal acquired at the signal detection step. The location where the detected signal was observed and the location where the failure occurred are not necessarily the same location. Various patterns are conceivable depending upon the failure mode. Reference will be had to FIGS. 8 to 12 to describe various patterns showing relationships between position on a circuit where a detected signal was obtained and position on a circuit where a failure (a physical defect) actually occurred.

Figure 8:
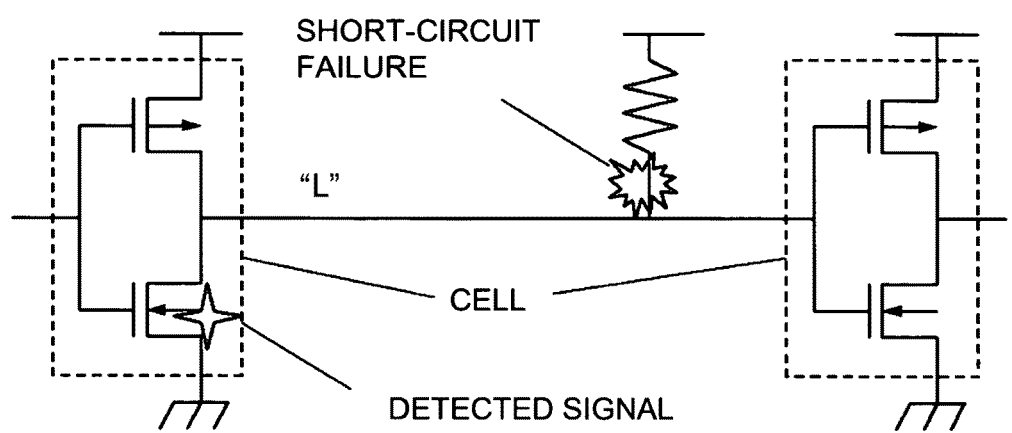
FIG. 8 is an explanatory view illustrating an example of the relationship between a physical defect, which is the target of analysis, and a detected signal in the present invention.

FIG. 8 shows an example in which a net where the signal level is the low level is shorted to a high-level power-source line. Although an actual failure (physical defect) occurs in a line, it is an inverter-circuit cell on the input side of this net where the detected signal is observed. Since an N-channel MOS transistor in the inverter circuit turns on and a through-current flows between it and the high-level power source through the short-circuit failure, a light emission is observed.

Figure 9:
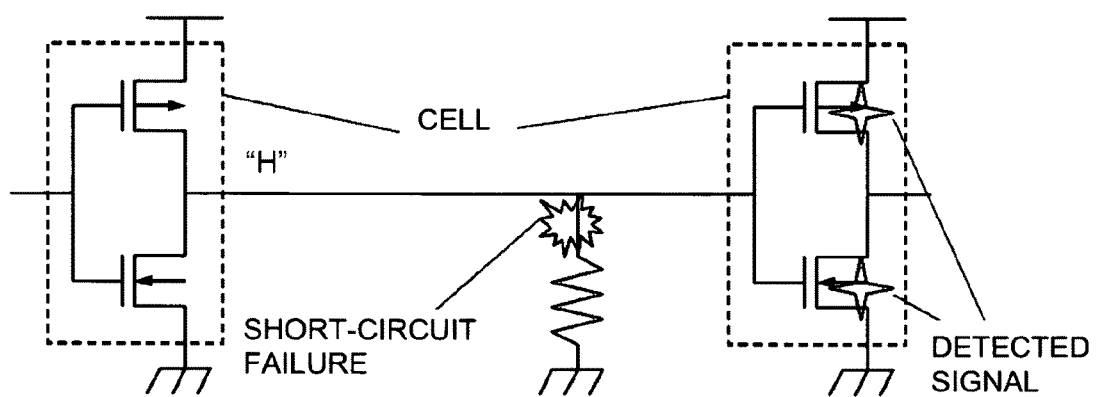
FIG. 9 is an explanatory view illustrating another example of the relationship between a physical defect, which is the target of analysis, and detected signals in the present invention.
Figure 10:
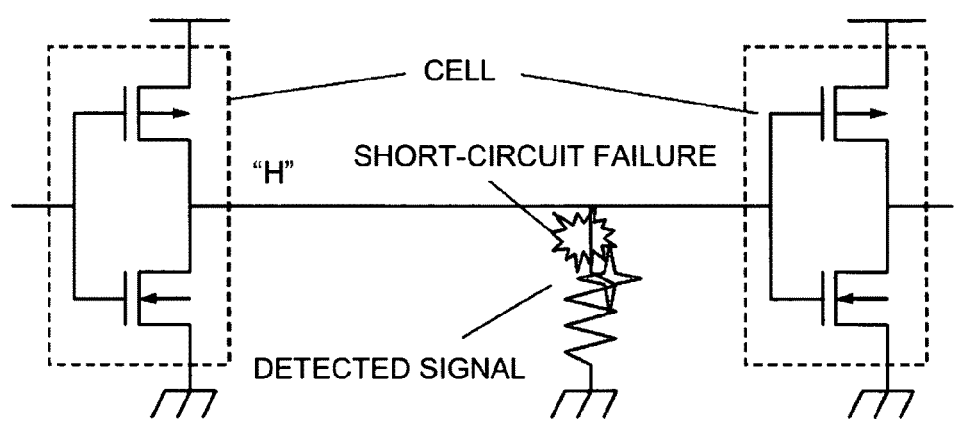
FIG. 10 is an explanatory view illustrating a further example of the relationship between a physical defect, which is the target of analysis, and a detected signal in the present invention.
Figure 11:
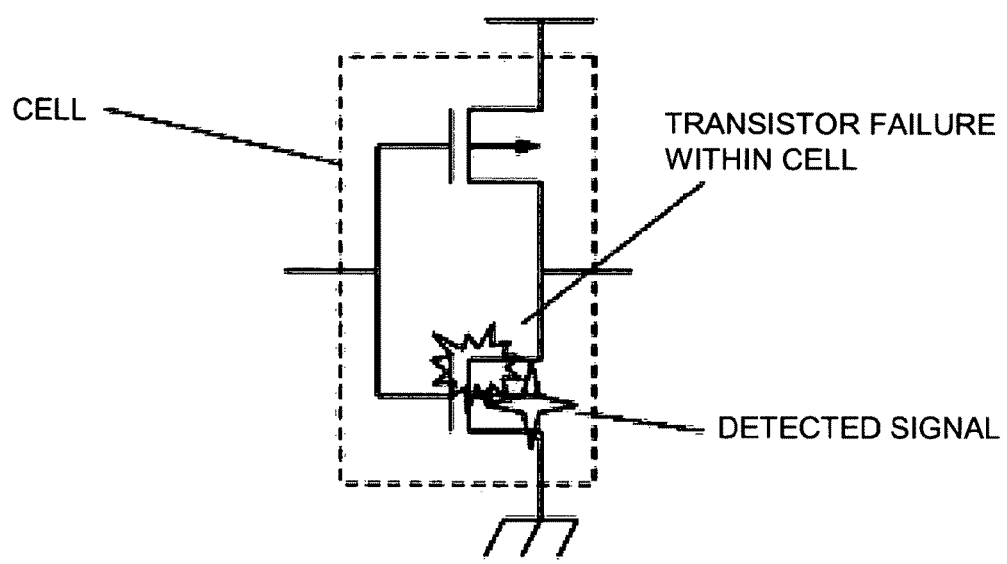
FIG. 11 is an explanatory view illustrating yet another example of the relationship between a physical defect, which is the target of analysis, and a detected signal in the present invention.
Figure 12:
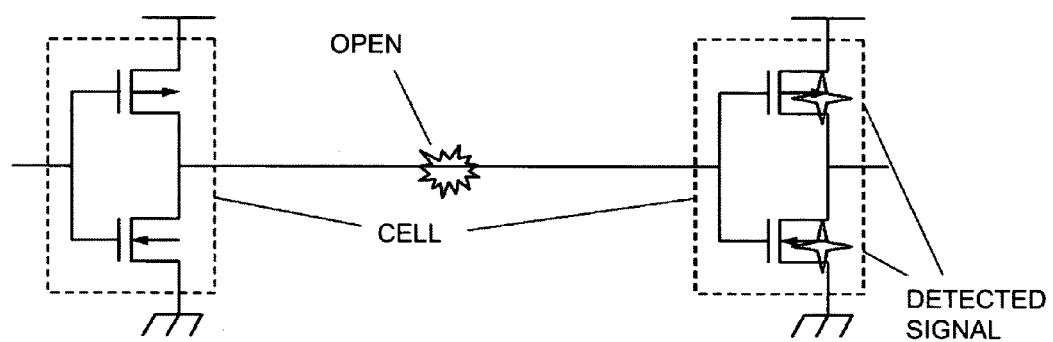
FIG. 12 is an explanatory view illustrating yet another example of the relationship between a physical defect, which is the target of analysis, and detected signals in the present invention.

In FIG. 9, a net where the signal level is the high level has been shorted to a ground line. As a result, the net attains an intermediate potential, a through-current flows into the MOS transistors of the inverter circuit on the output side of the net and light emissions are observed. Further, as illustrated in FIG. 10, there are also cases where even though the failure mode is the same as that shown in FIG. 9, a light emission is observed at the same location as that where the short-circuit failure occurred. Furthermore, as illustrated in FIG. 11, there are also instances where, if a physical defect such as gate leakage has occurred at a transistor within a cell, a light emission is observed within the cell. In FIG. 12, a net attains an intermediate potential owing to severance of the net, a through-current flows in the cell on the output side from the location of the severance and emission currents are observed.

In FIGS. 8, 9, 11 and 12 described above, a detected signal is observed within a cell. In such cases, the failure exists inside the cell in which the detection has been observed or in the net that is connected to this cell.

On the other hand, in a case where a detected signal has been observed on a net, as in FIG. 10, the failure exists in the net where the detected signal has been observed or in the cell connected to this net.

Accordingly, at the circuit extraction step, the cell where the detected signal was detected and the net connected to this cell, or the net where the detected signal was detected and the cell connected to this net, are extracted.

When the circuit is extracted, the extraction is performed using data of the layer and coordinates of the layout, which is design data, and the circuit connection data. Even if the coordinates are the same in terms of a plane, there are instances where the cell and upper-layer wiring (a net) that is unrelated to the cell are laid out in superimposed form. In a case where the layer of a detected signal has been identified at the signal detection step, circuit extraction is performed using this layer data as well. That is, the circuit extraction step includes processing for layer designation (step S41), coordinate region designation (step S42) and cell/net extraction (step S43).

Finally, the collation step (step S5) collates the inspection step name and in-chip coordinates obtained at the physical defect inspection step with the layer and coordinates of the circuit obtained at the circuit extraction step, and identifies the circuit where the detected signal was detected and the physical defect. In this case, the collation step includes layer determination processing (step 51), which is for making a collation determination between inspection step identifying information and layer of the circuit, and coordinate-region determination processing (step S52), which is for making a collation between in-chip coordinates and coordinates of the circuit.

The determination for collating the inspection step name and circuit layer is carried out using inspection step/layer correspondence data shown in FIG. 7. That is, depending upon at which stage of the manufacturing process a physical defect has been discovered by visual inspection, the layer in which this physical defect exists can be identified. For example, with reference to FIG. 7, the following items are recorded with regard to a physical defect discovered at the inspection step "STEP 1": layer: METAL 2 (second wiring layer), VIA 2 (second via) and METAL 3 (third wiring layer). Thus the fact that the physical defect discovered at the inspection step "STEP 1" is a physical defect in any of the second wiring layer, second via and third wiring layer can be determined. Accordingly, a collation is performed to determine whether the layer of the circuit extracted at the circuit extraction step agrees with this layer. By thus correlating an inspection step and a layer, whether a physical defect that occurred at a particular step of a process at the time of manufacture is the cause of a detected signal can be specified accurately. It should be noted that rather than using the inspection step/layer correspondence data shown in FIG. 7, a layer in which a physical defect is believed to exist may be input as data in place of the inspection name in the physical defect data (see FIG. 4).

A variation of the first exemplary embodiment will be described next. The signal detection step (step S3) may be adapted to acquire an image that includes a detected signal. At the circuit extraction step, the image and the design data of the layout can be superimposed and a circuit through which the detected signal passes can be extracted. In particular, in a case where it is doubtful as to whether the detected signal obtained at the signal detection step is one specific to a malfunctioning chip, the technician observes the image and can determine whether the signal is a genuine detected signal specific to a malfunctioning chip or a false detected signal also generated by a conforming chip.

Further, at the circuit extraction step, extraction of a circuit in which a detected signal was detected is performed using the coordinates of the detected signal and the coordinates of the layout design data. However, the coordinates of the detected signal may be expanded into a nearby specific zone and the cell or net in which the detected signal was detected may be specified. A specific example of this is illustrated in FIGS. 13 and 14. FIG. 13 is a diagram illustrating an example of image data in which a detected signal and layout of an extracted circuit are displayed in superimposed form, and FIG. 14 is a diagram for describing FIG. 13. As identification is difficult with FIG. 13, reference will be had to FIG. 14 for the description. The four small circles 41a, 41b, 41c and 41d in FIG. 14 are detected signals. The rectangles 42a, 42b, 42c and 42d centered on the detected signals 41a, 41b, 41c and 41d, respectively, are detected signal expansion regions obtained by expanding the coordinates of the detected signals into nearby specific zones. Reference characters 43a, 43b, 43c and 43d denote cells in which at least some coordinates overlap the detected signal expansion regions. That is, cells 43a, 43b, 43c and 43d within the nearby specific zones of the detected signals 41a, 41b, 41c and 41d have been extracted. Furthermore, a net 44, which is the net connected to the cells 43a, 43b, 43c and 43d, has been extracted. It should be noted that the cells 43a, 43b, 43c, 43d and net 44 are data that has been extracted from the design data.

FIGS. 13 and 14 are an example in which two nets are shorted together, as a result of which the net 44 attains the intermediate potential, a through-current flows into the receiver cells 43a, 43b, 43c and 43d and emission currents are observed. Although an offset the cause of which is a coordinate error in the analyzer has occurred between the locations of the light emissions and the extracted cells, the net in which the physical defect exists can be extracted by performing circuit extraction upon taking this coordinate error into account. In this example, the failed net cannot be extracted as long as the coordinate error is not taken into account. In the example of FIGS. 13 and 14, the coordinates of the detected signals 41a, 41b, 41c and 41d have been expanded into nearby rectangular regions 42a, 42b, 42c and 42d. However, cells and nets may just as well be extracted by expanding the coordinates into concentric circles or polygonal regions besides the above-mentioned rectangular regions.

Furthermore, at the collation step, the coordinates of the circuit of a cell or net extracted at the circuit extraction step may be collated by expanding them into a nearby specific zone and determining whether they agree with the coordinates of the physical defect. As a result, collation can be performed correctly even in a case where an error has occurred in the coordinates of the physical defect obtained by inspection of the physical defect. As for ways to expand circuit coordinates, the circuit coordinates may be expanded into concentric circles or the circuit may be expanded along each of the X and Y coordinates. Expansion into a polygonal region also is possible. FIG. 15, which is an example described in conjunction with FIGS. 13 and 14, is an explanatory view of a case where coordinates of a circuit are expanded along the X and Y directions and collated with a physical defect. A physical defect 46, which is the location of a short to another net, gives rise to an error in the coordinates obtained at the physical defect inspection, and the coordinates of the physical defect 46 do not agree with the coordinates of the net 44 in the design data. A circuit-coordinate expansion region 45 is a region obtained by expanding the coordinates of the cells and nets, which were extracted at the circuit extraction step, along the X and Y directions. The coordinates of the physical defect 46 overlap the coordinates of the circuit-coordinate expansion region 45. As a result, it can be confirmed that the cause of detected signals 41a, 41b, 41c and 41d is the physical defect 46.

Further, even if instead of expanding circuit coordinates into a nearby specific zone the coordinates of a physical defect are expanded into a nearby specific zone and a collation is performed to determine whether this zone contains circuit coordinates, the same effects are obtained. In FIG. 16, a region obtained by expanding the coordinates of the physical defect 46 into a concentric circle from the center of the defect is adopted as a physical-defect expansion region 47. Since the net 44 extracted at the circuit extraction step and the coordinates of the physical-defect expansion region 47 overlap, the fact that the cause of the detected signals 41a, 41b, 41c, and 41d is the physical defect 46 can be confirmed by this method as well.

Second Exemplary Embodiment

FIG. 17 is a block diagram illustrating the configuration of a failure analyzer of a semiconductor integrated circuit according to a second exemplary embodiment of the present invention. The failure analysis method of the first exemplary embodiment can be implemented also by using the failure analyzer of a second exemplary embodiment. The failure analyzer shown in FIG. 17 comprises a chip selecting unit 5 for selecting a defective chip from results of a test applied to each chip of a wafer; a signal detecting unit 9 for acquiring a detected signal, which is produced by analyzer 7, with respect to a chip selected as being defective; a circuit extracting unit 11 for extracting a circuit associated with the detected signal; a collating unit 14 for collating physical defect data acquired by physical defect inspection and circuit extraction data obtained by the circuit extracting unit, and extracting a physical defect for which a match has been obtained; and a display unit 16 for displaying collation-result data.

The chip selecting unit 5 conducts a logic test based upon test data that is output by an LSI tester 3, and outputs selection data 6. The selection data 6 includes a chip position of a malfunctioning chip in a semiconductor wafer.

The signal detecting unit 9 extracts a detected signal from analytical data 8 that is output by the analyzer 7, such as an emission analysis or OBIRCH analysis, with regard to a malfunctioning chip specified by selection data, and outputs the signal as detected signal data 10. As shown in FIG. 6, the detected signal data 10 includes chip position in the wafer, and the coordinates and layer of a detected signal, which is a thermal emission or light emission from the chip, acquired by the analyzer. The data that is output by the signal detecting unit 9 may contain image data that includes a detected signal.

The detected signal data 10 and design data 12 are input to the circuit extracting unit 11, which proceeds to output circuit extraction data 13. The circuit extracting unit 11 extracts a layer and coordinates of a circuit with regard to a cell in which the detected signal was detected and a net connected to this cell, or a net in which the detected signal was detected and a cell connected to this net, and outputs the layer and coordinates of the circuit as circuit extraction data 13. The data that is output by the circuit extracting unit 11 may further contain image data of design data of the cell or net extracted in the image data that includes the detected signal.

Physical defect data 2 that is output by the physical defect inspection apparatus 1, such as a visual inspection apparatus, inspection step/layer correspondence data 15, which is data indicating correspondence between inspection step identifying information (e.g., inspection step name) and circuit layer, and circuit extraction data 13 are input to the collating unit 14, which identifies physical defect data 2 associated with the circuit extracted by the circuit extracting unit 11, and outputs the data as collation-result data 17. As illustrated in FIG. 4, the physical defect data 2 includes the chip position, in the semiconductor wafer, of the semiconductor integrated circuit chip in which the physical defect was discovered; the inspection step name under which the physical defect was discovered; the center coordinates of the physical defect in the chip; and the size of the defect. As shown in FIG. 7, the inspection step/layer correspondence data 15 includes the inspection step name and the layers in which it is believed the physical defect detected at this inspection step exists. The inspection step at which the physical defect was detected and the design layout layer in which the physical defect exists are collated using this inspection step/layer correspondence data. Further, the result display unit 16 displays the collation-result data 17 on a display screen, etc.

On the basis of the inspection step/layer correspondence data 15, the data that is the inspection step name of the physical defect data 2 and the data that is the layer of the circuit extraction data 13, the collating unit 14 collates the inspection step of the physical defect and the layer of the circuit extracted from the detected signal. Further, the collating unit 14 expands the coordinates of the circuit contained in the circuit extraction data 13 into a nearby specific zone and performs collation to determine whether there is overlap between the circuit coordinates and the in-chip coordinates of the physical defect, thereby collating the coordinates of the physical defect with the coordinates of the circuit. In accordance with such an arrangement, the circuit in which the detected signal was detected and the physical defect can be collated even if there is an error in the coordinates of the physical defect. Further, the same effects are obtained even if collation is performed by expanding in-chip coordinates of the physical defect into a nearby specific zone instead of expanding circuit coordinates into a nearby specific zone.

Furthermore, the circuit extracting unit 11 may expand coordinates of a detected signal into a nearby specific zone and extract the layer and coordinates of a circuit with regard to a cell in the specific zone neighboring the detected signal and nets connected to this cell or a net passing through a layer of a detected signal and located in a specific zone neighboring the detected signal and cells connected to this net. If this arrangement is adopted, the circuit associated with the detected signal can be extracted even if a coordinate error develops in the analyzer.

Third Exemplary Embodiment

FIG. 18 is a block diagram of a failure analysis apparatus according to a third exemplary embodiment of the present invention. The third exemplary embodiment is one in which a computer is used to implement the failure analysis apparatus of the second exemplary embodiment.

The failure analysis apparatus of FIG. 18 includes a CPU 21; an input unit 22 for inputting commands for executing a program; an output unit 23; a storage unit 24; and an external data acquisition unit 25 for acquiring design data. These components are interconnected by a bus line 27.

The storage unit 24 may include, besides a main storage device such as a cache or semiconductor memory, an auxiliary storage device such as a hard disk or a magnetic storage medium or optical storage medium such as a CD or DVD. Stored in the storage unit 24 is a failure analysis program 26 for causing the CPU 21 to execute the signal detection step (step S3), circuit extraction step (step S4) and collation step (step S5) described in the failure analysis method of the first exemplary embodiment illustrated in FIG. 1. Also stored in the storage unit 24 is the externally acquired test data 4, the selection data 6, analytical data 8, physical defect data 2, design data 12, circuit extraction data 13, detected signal data 10 and collation-result data 17.

The output unit 23 outputs the analytical data 8 at the signal detection step when a detected signal is extracted from the analytical data 8. Further, the output unit 23 displays the design data 12 when a circuit is extracted from the detected signal data 10 at the circuit extraction step. At this time the analytical image of the chip and the design image may be displayed in superimposed form. Further, at the collation step, the output unit 23 displays the circuit extraction data 13 and the result of collation extracted from the physical defect data 2 at the collation step. At this time the physical defect image obtained by the physical defect inspection may be displayed. The inspection step/layer correspondence data 15 may also be displayed.

In this exemplary embodiment, signal detection processing (step S3) is executed in accordance with the failure analysis program 26 based upon the detected signal. Further, the CPU 21 may execute signal detection processing based upon a detected signal that the operator has designated using the input unit 22. Furthermore, the CPU 21 executes the circuit extraction step (step S4) based upon the detected signal data 10, executes the collation step (step S5) based upon the inspection step/layer correspondence data 15 and displays the result of collation on the display of the computer using the output unit 23. The inspection step/layer correspondence data 15 may be designated by the operator using the input unit 22 or may be input from the external data acquisition unit 25. The nature of the processing of the signal detection step, circuit extraction step and collation step is similar to that of the method of analyzing failure of a semiconductor integrated circuit already described.

It may be so arranged that that the physical defect inspection apparatus 1 or LSI tester 3 is connected to the bus line 27, the physical defect inspection apparatus 1 or LSI tester 3 is controlled by the failure analysis program 26 and the physical defect inspection step and/or chip selection step are executed.

Further, a computer in which the failure analysis program of the semiconductor integrated circuit has been installed functions as the failure analysis apparatus having the signal detecting unit 9, circuit extracting unit 11 and collating unit 14 shown in FIG. 17. Further, the physical defect inspection apparatus 1 or LSI tester 3 may be connected via a network or the like, the entire system inclusive of the physical defect inspection apparatus 1 or LSI tester 3 may function as the failure analysis apparatus illustrated in FIG. 17, and the failure analysis program 26 may control the entire system inclusive of the physical defect inspection apparatus 1 or LSI tester 3. The computer may be an ordinary engineering workstation or personal computer equipped with an output unit such as a display, an input unit such as a keyboard and mouse, an auxiliary storage device such as a DVD or CD-ROM, and an external interface function such as a network connection. Further, the LSI failure analysis program 26 can be installed in the computer via a computer-readable storage medium, such as a semiconductor memory, magnetic storage device, or optical storage device, or the Internet.

Though the present invention has been described in accordance with the foregoing exemplary embodiments, the invention is not limited to these exemplary embodiments and it goes without saying that the invention covers various modifications and changes that would be obvious to those skilled in the art within the scope of the claims.

For example, the detected signal is not limited to a light emission from an emission analysis or to an OBIRCH reaction from an OBIRCH analysis. With respect to an LSI chip, it will suffice if the detected signal is from an analyzer for receiving an electrical signal, infrared radiation, visible light, ultraviolet radiation, a laser, X rays, electrons, ions, ultrasonic waves or vibration, etc., as an input, for detecting an electrical signal, infrared radiation, visible light, ultraviolet radiation, a laser, X rays, electrons, ions, ultrasonic waves or vibration, etc.

In the present invention, the following modes are possible.

(Mode 1): as mentioned as the first aspect.

(Mode 2):
The method may further comprise acquiring an image that includes the detected signal and displaying the image and layout design data in superimposed form to extract a layer and coordinates of a circuit associated with the detected signal.

(Mode 3):
The method may further comprise expanding coordinates of the circuit into a nearby specific zone to be collated with the in-chip coordinates of the physical defect.

(Mode 4):
In a case where the coordinates of the circuit reside in a specific region near a physical defect, the physical defect is extracted and collated with the circuit.

(Mode 5):
Extracting the layer and coordinates of the circuit may comprise, using the design data, extracting the layer and coordinates of the circuit with regard to a cell in a specific zone near the detected signal and a net connected to this cell, or a net passing through the layer of the detected signal and located in a specific zone near the detected signal and a cell connected to this net.

(Mode 6): as mentioned as the second aspect.

(Mode 7):
The signal detecting unit outputs image data that includes a detected signal, and the circuit extracting unit superimposes the image data and layout design data and extracts the circuit and outputs the circuit as circuit extraction data.

(Mode 8):
The collating unit collates an inspection step of a physical defect with the layer of the circuit extracted from the detected signal, based upon the inspection step/layer correspondence data, the inspection step identifying information of the physical defect data, and the layer of the circuit extraction data, expands the coordinates of the circuit into a nearby specific zone and performs collation to determine whether there is overlap with the in-chip coordinates of the physical defect, thereby collates the coordinates of the physical defect with the coordinates of the circuit.

(Mode 9):
The collating unit collates an inspection step of a physical defect with the layer of the circuit extracted from the detected signal, based upon the inspection step/layer correspondence data, the inspection step identifying information of the physical defect data, and the layer of the circuit extraction data, expands the in-chip coordinates of the physical defect into a nearby specific zone and collates coordinates of the nearby specific zone with the coordinates of the circuit.

(Mode 10):
The circuit extracting unit, using the design data, extracts the layer and coordinates of the circuit with regard to a cell in a specific zone near the detected signal and a net connected to this cell, or a net passing through the layer of the detected signal and located in a specific zone near the detected signal and a cell connected to this net.

(Mode 10): as mentioned as the third aspect.

(Mode 11): as mentioned as the fourth aspect.

(Mode 12): as mentioned as the fifth aspect.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method of analyzing a failure of a semiconductor integrated circuit chip, said method comprising:
    inspecting a physical defect in a semiconductor wafer, by a visual inspection apparatus, at a time of manufacture of a semiconductor integrated circuit chip,
    acquiring, by the visual inspection apparatus, a chip position with respect to the semiconductor wafer identifying information of said physical defect and in-chip coordinates of the physical defect in an inspection step;
    subjecting the semiconductor integrated circuit to a logic test by a chip selecting unit, wherein the logic test comprises test data input into a chip under test;
    extracting, by the chip selecting unit, a malfunctioning chip and a position of said malfunctioning chip on the semiconductor wafer based on the logic test;
    analyzing, by a signal detecting unit, a detected signal observed from the malfunctioning chip based on the test data input into the malfunctioning chip;
    acquiring, by the signal detecting unit, circuit coordinates and a layer of the detected signal;
    extracting, by a circuit extracting unit, a layer and circuit coordinates in a design layout, with regard to a cell in which the detected signal was detected and a net connected to said cell, or a net in which the detected signal was detected and a cell connected to said net, using design data and the circuit coordinates and layer of the detected signal;

collating, by a collating unit, the chip position with respect to the semiconductor wafer, the layer of the circuit in the design layout, the in-chip coordinates of the physical defect from the inspection step and the circuit coordinates in the design layout from the extracting unit; and
identifying, by the collating unit, the physical defect associated with the malfunctioning chip from the collating.

2. The method according to claim 1, further comprising:
acquiring an image that includes the detected signal; and
displaying the image and layout design data in superimposed form to extract a layer and circuit coordinates of the detected signal.

3. The method according to claim 1, further comprising:
expanding circuit coordinates into a nearby specific zone to be collated with the in-chip coordinates of the physical defect.

4. The method according to claim 1, wherein in a case where the circuit coordinates reside in a specific region near a physical defect, said physical defect is extracted and collated with the circuit.

5. The method according to claim 1, wherein said extracting the layer and circuit coordinates in the design layout comprises, using the design data, extracting the layer and circuit coordinates with regard to a cell in a specific zone near the detected signal and a net connected to said cell, or a net passing through the layer of the detected signal and located in a specific zone near the detected signal and a cell connected to said net.

6. A non-transitory computer-readable storage medium storing a program for causing a computer to execute the method of analyzing failure of a semiconductor integrated circuit set forth in claim 1.

7. The method according to claim 1, wherein the inspecting of the physical defect in a semiconductor wafer acquires a chip position with respect to the semiconductor integrated circuit.

8. The method according to claim 1, wherein the subjecting comprises subjecting of the semiconductor integrated circuit to the logic test in the semiconductor wafer and extracting the malfunctioning chip and a position of said chip.

9. The method according to claim 1, wherein the analyzing of the detected signal is input to the semiconductor integrated circuit chip from the logic test.

10. The method according to claim 1, wherein the extracting of the layer and the circuit coordinates in the design layout is with regard to the cell in which the detected signal was detected and a net connected to said cell using design data and the coordinates and layer of the detected signal.

11. An apparatus including a processor and a non-transitory memory for analyzing failure of a semiconductor integrated circuit, said apparatus comprising:
a visual inspection apparatus that acquires, at a time of manufacture of a semiconductor integrated circuit chip, in-chip coordinates of the physical defect and a chip position with respect to the semiconductor wafer in an inspection step;
a chip selecting unit that subjects a semiconductor integrated circuit chip to a logic test based upon test data, and outputs selection data including a chip position of a malfunctioning chip in a semiconductor wafer, wherein the logic test comprises test data input into a chip under test;
a signal detecting unit, which includes an analyzer, that analyzes a detected signal from the test data, which has been observed from the malfunctioning chip, by the analyzer, and outputs detected signal data including circuit coordinates and a layer of the detected signal;
a circuit extracting unit that reads design data and the circuit coordinates and the layer of the detected signal and extracts a layer and circuit coordinates in a design layout, with regard to a cell in which the detected signal was detected and a net connected to said cell, or a net in which the detected signal was detected and a cell connected to said net, and outputs the layer and the circuit coordinates in the design layout;
a collating unit that collates:
the chip position with respect to the semiconductor wafer;
the in-chip coordinates of the physical defect;
the layer and the circuit coordinates in the design layout, and
correspondence between the in-chip coordinates of the physical defect, the chip position with respect to the semiconductor wafer and the layer in the design layout.
and based on the collation identifies the physical defect data associated with the circuit extracted by said circuit extracting unit, and outputs said data as collation-result data,
and
a display unit that displays the collation-result data.

12. The apparatus according to claim 11, wherein said signal detecting unit outputs image data that includes a detected signal; and
said circuit extracting unit superimposes the image data and layout design data, and extracts the circuit and outputs the circuit as circuit extraction data.

13. The apparatus according to claim 11, wherein said collating unit collates an inspection step of a physical defect with the layer of the circuit extracted from the detected signal, based upon the inspection step/layer correspondence data, the inspection step identifying information of the physical defect data and the layer of the circuit extraction data, expands the circuit coordinates into a nearby specific zone and performs the collation to determine whether there is an overlap with the in-chip coordinates of the physical defect, thereby collating the coordinates of the physical defect with the circuit coordinates in the design layout.

14. The apparatus according to claim 11, wherein said collating unit collates an inspection step of a physical defect with the layer of the circuit extracted from the detected signal, based upon the inspection step/layer correspondence data, the inspection step identifying information of the physical defect data, and the layer of the circuit extraction data, expands the in-chip coordinates of the physical defect into a nearby specific zone and collates coordinates of said nearby specific zone with the circuit coordinates in the design layout.

15. The apparatus according to claim 11, wherein said circuit extracting unit, using the design data, extracts the layer and circuit coordinates in the design layout, with regard to a cell in a specific zone near the detected signal and a net connected to said cell, or a net passing through the layer of the detected signal and located in a specific zone near the detected signal and a cell connected to said net.

16. A non-transitory computer-readable storage medium storing a program for causing a computer to function as the apparatus for analyzing failure of a semiconductor integrated circuit set forth in claim 11.

17. The apparatus according to claim 11, wherein a processor of a computer includes the chip selecting unit, the signal detecting unit, the circuit extracting unit, and the collating unit.

18. A non-transitory computer-readable storage medium storing a program for causing a computer to execute a failure analysis processing, the processing comprising:

inspecting a physical defect in a semiconductor wafer, by a visual inspection apparatus, at a time of manufacture of a semiconductor integrated circuit chip, acquiring, by the visual inspection apparatus, a chip position with respect to the semiconductor wafer, an inspection step identifying information of said physical defect and in-chip coordinates of the physical defect in an inspection step;

subjecting the semiconductor integrated circuit to a logic test by a chip selecting unit, wherein the logic test comprises test data input into a chip under test;

signal detection processing that extracts detected signal data based on the test data input into the chip that includes circuit coordinates and a layer from a detected signal from analytical data that is a result of failure analysis of a semiconductor integrated circuit by an analyzer;

circuit extraction processing, by a circuit extracting unit, that includes inputting design data of the semiconductor integrated circuit and the detected signal data, extracting a layer and circuit coordinates in a design layout, with regard to a cell in which the detected signal was detected and a net connected to said cell, or a net in which the detected signal was detected and a cell connected to said net, and outputting the layer and circuit coordinates in the design layout as circuit extraction data;

collation processing, by a collating unit, that includes collating the chip position with respect to the semiconductor wafer, the in-chip coordinates of the physical defect, the layer and the circuit coordinates in the design layout, and correspondence between the in-chip coordinates of the physical defect, the chip position with respect to the semiconductor wafer and the layer in the design layout, and based on the collation, identifying the physical defect data associated with the circuit extracted by said circuit extraction processing, and outputting said data as collation-result data;

and display processing that displays the collation-result data.

* * * * *